(12) United States Patent
Lee (10) Patent No.: US 8,140,193 B2
(45) Date of Patent: Mar. 20, 2012

(54) ASSESSING, FORECASTING AND SIMULATING ENERGY CONSUMPTION OF BUILDINGS USING ENERGY EFFICIENCY COEFFICIENTS

(75) Inventor: Young Min Lee, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 12/697,787

(22) Filed: Feb. 1, 2010

(65) Prior Publication Data

US 2011/0190951 A1   Aug. 4, 2011

(51) Int. Cl.
*G05D 11/00*   (2006.01)
(52) U.S. Cl. ......................... 700/291; 700/286
(58) Field of Classification Search .................. 700/286, 700/291
See application file for complete search history.

(56) References Cited

U.S. PATENT DOCUMENTS

| | | | |
|---|---|---|---|
| 6,785,620 B2 | 8/2004 | Kishlock et al. | |
| 7,200,468 B2* | 4/2007 | Ruhnke et al. | 700/300 |
| 2010/0211222 A1* | 8/2010 | Ghosn | 700/276 |
| 2011/0015798 A1* | 1/2011 | Golden et al. | 700/291 |
| 2011/0016017 A1* | 1/2011 | Carlin et al. | 705/26.4 |
| 2011/0161251 A1* | 6/2011 | Carey et al. | 705/412 |
| 2011/0166913 A1* | 7/2011 | Buchanan | 705/7.39 |

OTHER PUBLICATIONS

Fels, M.F. "PRISM: An Introduction". Energy and Buildings, vol. 9 (1986) 5-18.*
Kissock, J.K., Eger, C. "Measuring Industrial Energy Savings". Applied Energy 85 (2008) 347-361.*
Fels et al., Advancing the Art of PRISM Analysis, Jul./Aug. 1995, Home Energy Magazine Online, http:// www.homeenergy. org/ archive/ hem. dis. anl. gov/ eehem/ 95/ 950709. html.

* cited by examiner

*Primary Examiner* — Ryan Jarrett
(74) *Attorney, Agent, or Firm* — Scully, Scott, Murphy & Presser, P.C.; Stephen C. Kaufman, Esq.

(57) ABSTRACT

Energy consumption data of a building and temperature data outside the building collected over a period of time are correlated and segmented into a plurality of segments including at least a heating consumption segment, a cooling segment, and temperature-insensitive segment. An energy efficiency coefficient for heating from the heating consumption segment, an energy efficiency coefficient for cooling from the cooling consumption segment, an energy efficiency coefficient for other energy consuming activities from the temperature insensitive segment are determined, and scaled. The energy efficiency coefficient for heating, the energy efficiency coefficient for cooling and the energy efficiency coefficient for other energy consuming activities are used to assess energy efficiency among one or more buildings, forecast future consumption of energy in the building based on forecasted temperature and simulate impact of hypothetical temperature and hypothetical energy efficiency on energy consumption in the building.

25 Claims, 7 Drawing Sheets

ASSESSING, FORECASTING AND SIMULATING ENERGY CONSUMPTION OF BUILDINGS USING ENERGY EFFICIENCY COEFFICIENTS

FIELD

The present application generally relates to assessing, forecasting and simulating energy consumption of buildings using energy efficiency coefficients.

BACKGROUND

Saving energy and improving efficiency of energy consumption (which also reduces greenhouse gas emissions) are key initiatives in many parts of the world. One of the big sources of energy consumption is buildings, for example, business buildings, schools, public buildings, airports and residential buildings, and other, whose energy use also contributes to $CO_2$ emission.

Advancing the Art of PRISM Analysis, Fels, Kissock, Marean & Reynolds, July/August 1995, Home Energy Magazine Online, "http://www.homeenergy.org/archive/hem.dis.anl.gov/eehem/95/950709.html" (referred to herein as Fels et al.) discloses computing weather-adjusted index of energy consumption of buildings by using monthly billing data from a house or buildings and weather data. Fels et al. compute, compare and report the weather-adjusted index of energy consumption for a period before and after installation of energy conservation measure. However, Fels et al. do not disclose how to forecast the energy consumption of future period using the forecasted future weather and the energy efficiency coefficients or how to simulate the energy consumption for hypothetical building with hypothetical efficiency and weather condition using the energy efficiency coefficients. Fels et al. do not show how to the scale the energy efficiency by building characteristics such as space or hours of operations, how to use the scaled energy efficiency to assess energy efficiency among a group of buildings, and how to simulate energy consumption of hypothetical building and for hypothetical situations.

Energy Efficiency Measuring System and Reporting Methods, Kishlock et al., U.S. Pat. No. 6,785,620 B2, Aug. 31, 2005 (referred to herein as Kishlock et al.) discloses computing energy efficiencies of retail customers for two periods, one before energy saving measure (such as resetting thermostats, purchasing more energy efficient products such as sub-compact fluorescent light bulbs, high efficiency heating and cooling units, weatherizing windows and doors) and one after the energy saving measures, also by using energy consumption data and weather data. However, Kishlock et al. do not disclose how to forecast the energy consumption of future period using the forecasted future weather and the energy efficiency coefficients or how to simulate the energy consumption for hypothetical building with hypothetical efficiency and weather condition using the energy efficiency coefficients. Kishlock et al. also do not show how to scale the energy efficiency by building characteristics such as space or hours of operations, how to use the scaled energy efficiency to assess energy efficiency among a group of buildings, and how to simulate energy consumption of hypothetical building and for hypothetical situations.

Fels at al. & Kishlock et al. do not disclose how to compare energy efficiency between two or more buildings or the like or between two or more groups of buildings or the like.

BRIEF SUMMARY

A method and system for assessing, forecasting and simulating energy consumption of buildings using energy efficiency coefficients are provided. The method, in one aspect, may include correlating energy consumption data of a building and temperature data outside the building collected over a period of time; segmenting the correlated energy consumption data and temperature data into a plurality of segments including at least a heating consumption segment, a cooling segment, and temperature-insensitive segment; determining an energy efficiency coefficient for heating from the heating consumption segment; determining an energy efficiency coefficient for cooling from the cooling consumption segment; determining an energy efficiency coefficient for other energy consuming activities from the temperature insensitive segment; scaling the energy efficiency coefficients for heating, cooling and other energy consuming activity by building characteristics; and using the energy efficiency coefficient for heating, the energy efficiency coefficient for cooling and the energy efficiency coefficient for other energy consuming activities to assess energy efficiency among one or more buildings, forecast future consumption of energy in the building based on forecasted temperature, and simulate impact of hypothetical temperature and hypothetical energy efficiency on energy consumption in the building.

A system for assessing, forecasting and simulating energy consumption of buildings using energy efficiency coefficients, in one aspect, may include a processor and a memory operable to store energy consumption data of a building and temperature data outside the building collected over a period of time. The processor may be operable to correlate energy consumption data of a building and temperature data outside the building collected over a period of time. The processor may be further operable to segment the correlated energy consumption data and temperature data into a plurality of segments including at least a heating consumption segment, a cooling segment, and temperature-insensitive segment. The processor may be also operable to determine an energy efficiency coefficient for heating from the heating consumption segment. The processor yet further may be operable to determine an energy efficiency coefficient for cooling from the cooling consumption segment. The processor further may be operable to determine an energy efficiency coefficient for other energy consuming activities from the temperature insensitive segment. The processor further may be operable to scale the energy efficiency coefficient for heating, the energy efficiency coefficient for cooling and the energy efficiency coefficient for other energy consuming activities according to one or more building characteristics. The energy efficiency coefficient for heating, the energy efficiency coefficient for cooling and the energy efficiency coefficient for other energy consuming activities are used to assess energy efficiency among one or more buildings, forecast future consumption of energy in the building based on forecasted temperature and simulate impact of hypothetical temperature and hypothetical energy efficiency on energy consumption in the building.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

The present application discloses how to compute and scale energy efficiency coefficients of buildings for various energy consuming activities including for example, heating, cooling and other energy consuming activities, and use the coefficients to perform comparable assessment, forecasting and simulation of energy consumption of buildings. The present application also illustrates how to identify energy-efficient and inefficient buildings, how to forecast future energy consumption of the buildings with estimated future weather (e.g., temperature) using the energy efficiency coefficients, and how to simulate impact of hypothetical weather pattern (e.g., temperature) and energy efficiency on energy consumption also using the energy efficiency coefficients.

In another aspect, the present application discloses how to compute and scale multiple efficiency coefficients of energy consumption using time-series data on historic energy consumption of buildings, time-series data on weather (e.g., temperature data), data on energy consuming activities and building characteristics for groups of buildings. The coefficients computed may include but not limited to the coefficient of heating efficiency, coefficient of cooling efficiency and coefficients of other energy consumption activities such as lighting. The present application also discloses how to forecast future energy consumption using the forecasted future weather and the energy efficiency coefficients, and how to simulate energy consumption for hypothetical building with hypothetical situations.

Figure 1:
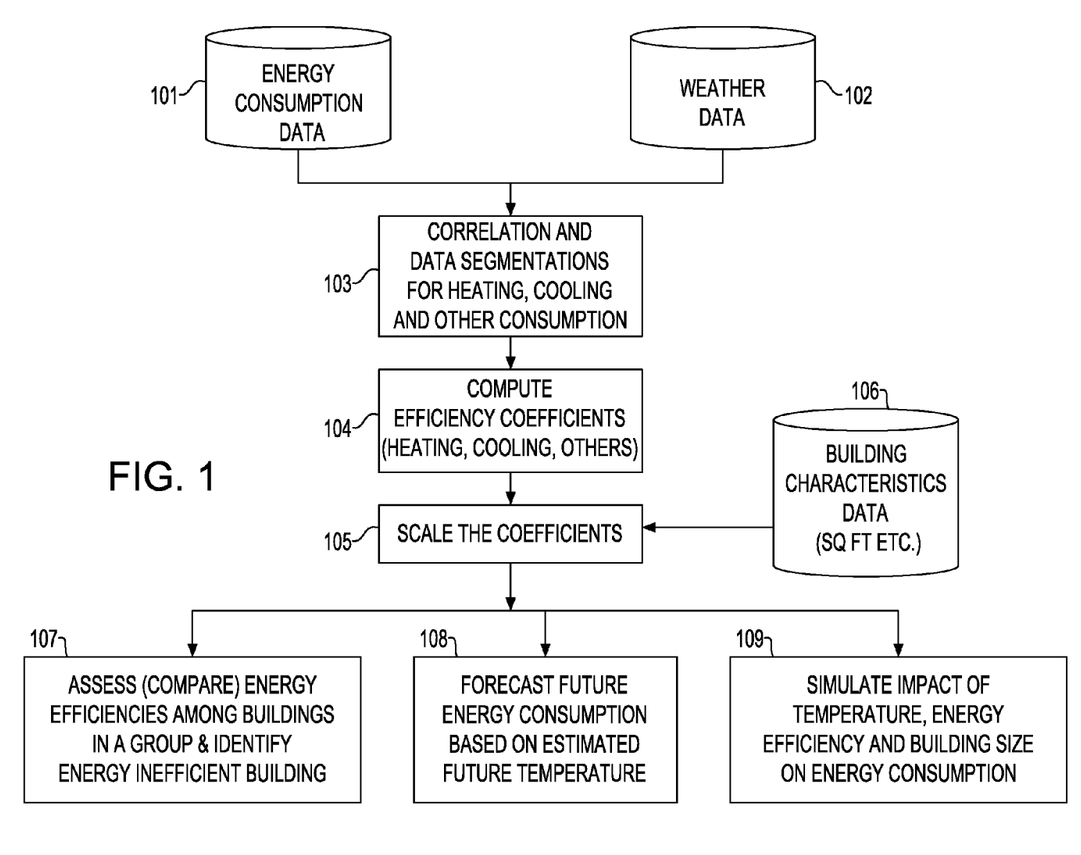
FIG. 1 shows a control flow or logic for assessing, forecasting and simulating energy consumption of buildings using energy efficiency coefficients in one embodiment of the present disclosure.

FIG. 1 shows a method of assessing, forecasting and simulating energy consumption in one embodiment of the present disclosure. In one embodiment, two types of time series data may be collected, i.e., time-series data on historic energy consumption (101) for a building, typically monthly or daily data for past several years or other such periodic data, and time-series data on average temperature (102) (monthly or daily or other such periodic data) in or near or in the vicinity of the area where the building is located. Also in one embodiment, building characteristics data (106) such as area of building (e.g., in square feet, square meters, or others), volume of buildings (e.g., cubic measurements or others) or number of occupants may be collected.

Figure 2:
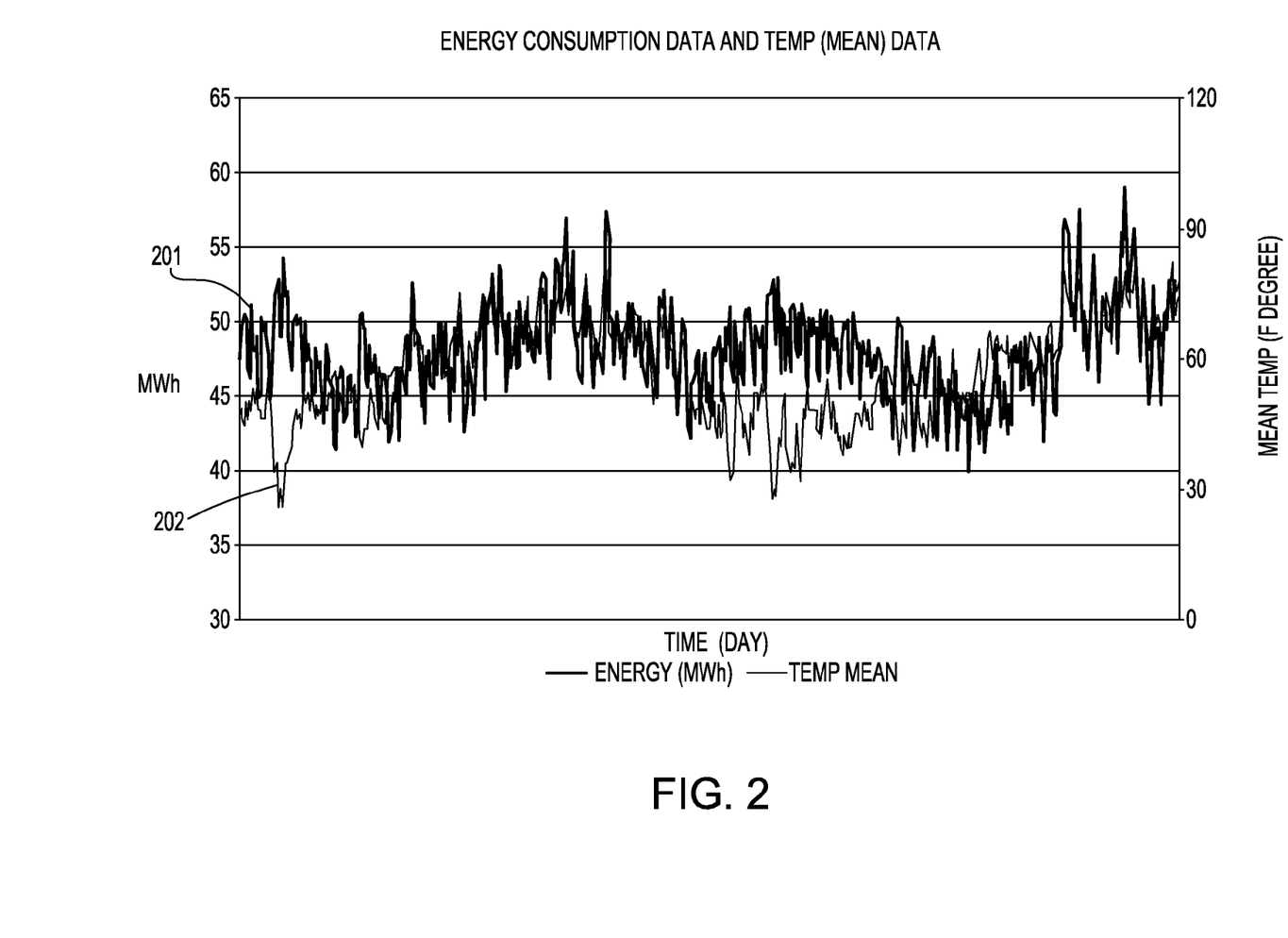
FIG. 2 shows an example of the time-series data.

FIG. 2 shows an example of the time-series data on historic electricity consumption (also referred to herein as electric energy consumption) of a building (e.g., 201 in FIG. 2; 101 in FIG. 1) and time-series data on air temperature (e.g., 202 in FIG. 2; 102 in FIG. 1) recorded in the area and/or nearby area where the building is located. The historic energy consumption (201) of a building shown in FIG. 2 is for daily recorded data, but it can also be monthly or other periodically recorded data. Such data for electricity can be obtained as meter data or other type of measurement. Reference item 201 in FIG. 2 shows electricity consumption data for all of heating, cooling, and other types of activities such as lighting and running equipments.

However, it is also possible that electric consumption excludes heating. Energy consumption data for heating instead may be obtained from other energy sources such as heating oil or natural gas or others.

While the example shown in FIG. 2 illustrates electricity consumption, any other types of energy consumption, including but not limited to heating oil, natural gas, and others may be plotted similarly and analyzed. Thus, for instance, the energy consumption data can be for electricity (e.g., in units of MWh or KWh) or fuel oil (e.g., in unit of gallon) or natural gas (e.g., in unit of cubic feet) or any other units of energy consumption.

Figure 3:
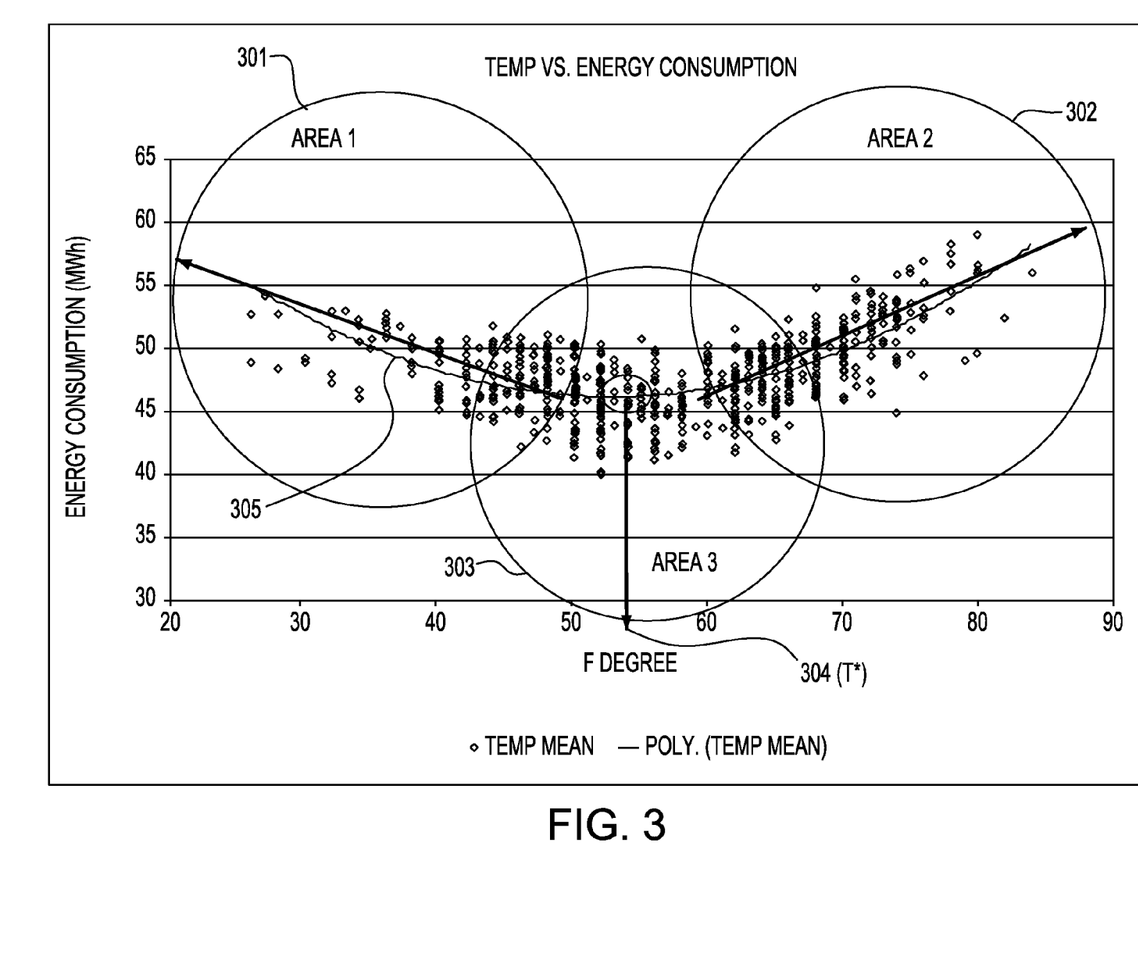
FIG. 3 shows an example of two time-series data plotted with respect to each other.

At 103 (FIG. 1), the time-series data of past energy consumption and the time-series data of temperature at a particular point in time are plotted as shown in FIG. 3, and the correlation between time-series data of past energy consumption and time-series data of temperature are analyzed through non-linear regression. Each point in the plot or graph (shown as dot in FIG. 3) represents an energy consumption data point in one particular unit time period (e.g., day, month etc.) and a corresponding temperature (average) for that unit time period. A non-linear regression curve is obtained as shown in 305 in FIG. 3. The data points (correlated time-series data of past energy consumption and time-series data of temperature) are segmented into three distinct areas of correlations as shown in the FIG. 3 example. Area 1 (301) contains data points where as temperature decreases, the energy consumption increases. This area corresponds to heating of the building. Area 2 (302) contains data points where as temperature increase, the energy consumption also increases. This area corresponds to cooling of the building. The third area, area 3 (303) contains data points where energy consumption is not responsive to the temperature changes. This area may correspond to other energy consumption activities such as lighting and equipment such as computer, stove, oven, vent, elevator, etc., which do not depend on the outside temperature. The base temperature (T*) here (304) is a reference temperature where the energy consumption is least sensitive to the temperature, i.e., temperature corresponding to the minimum energy consumption on the non-linear regression curve (305). The base temperature (T*) may be determined by obtaining a non-linear regression curve and picking the temperature point having the lowest energy consumption value on the curve.

In one embodiment, the data points (correlated time-series data of past energy consumption and time-series data of temperature) are segmented according to the three areas, and efficiency coefficient for heating is computed using the data points in area 1 (301 in FIG. 3), the efficiency coefficient for cooling is computer using the data points in area 2 (302 in FIG. 3). The data points in area 3 (303 in FIG. 3) can be used as the base energy consumption that is not related to the heating and cooling, or it can be used in computing efficiency coefficient of other type of energy consumption such as lighting as long as energy consumption data for various levels of the consumption type is available (e.g., energy consumption level for various lighting hours.).

FIG. 3 shows data points collected for energy consumption in which one type of energy, for example, electricity is used for both heating and cooling and other activities, e.g., other energy consuming activities. If different types of energy is used for heating than cooling, that is, one type of energy used for heating (e.g., heating oil) and another type of energy used for cooling (e.g., electricity), then there will be two separate plots or such correlations: one that plots temperature vs. heating oil consumption, and another that plots temperature vs. electricity consumption. The plot for heating oil consumption would contain the area that corresponds to heating, for example, data points that show energy consumption increasing as the temperature decreases. The plot for electricity consumption would contain that area that corresponds to cooling, for example, data points that show energy consumption increasing as the temperature increases. In such cases, a separate correlation analysis may be performed for each energy type, e.g., one for electricity, one for heating oil, one for natural gas, etc.

In another embodiment, the correlation analysis described above may be performed for one building or the like, and/or for a group of buildings or the like. For performing the correlation analysis for a group of buildings, the data points plotted, for example, shown in FIG. 3, would correspond to the data pertaining to all the buildings in the group (e.g., the average energy consumption of all the buildings in the group in one particular time period such as day or month, and the average outside temperature of the area where the buildings are located for the same time period).

Figure 4:
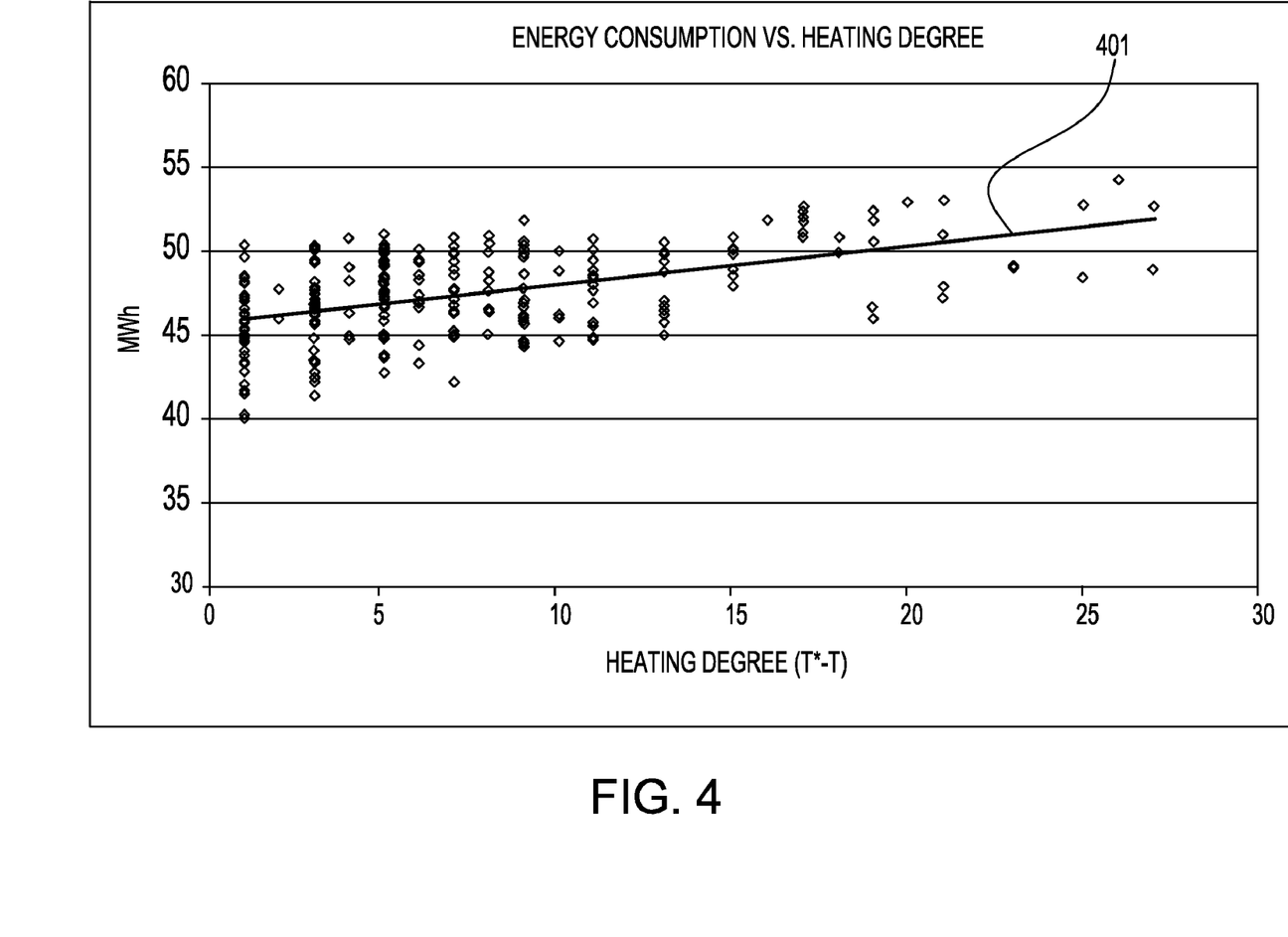
FIG. 4 illustrates a regression line for sample energy consumption with respect to heating degree.

Referring to FIG. 1, the efficiency coefficient of heating is computed at 104, for instance, by correlating energy consumption with respect to a heating degree. The heating degree may be defined as $(T^*-T)$, where $T^*$ is the base temperature described above and shown in FIG. 3 reference item 304, and T is the temperature value of each data point of the correlated time-series data of past energy consumption and time-series data of temperature (e.g., shown in FIG. 3). T, the temperature value of each data point may be the recorded average temperature outside the building being analyzed. The efficiency coefficient of heating may be computed by using the data points in the data segment area 1 (301 in FIG. 3) correlated to $(T^*-T)$, and by obtaining a linear regression line, for example, shown at 401 in FIG. 4. The heating regression line has an expression:

$$E_h = \alpha_h \cdot (T^*-T) + \beta_h \quad \text{(Equation 1)}$$

Here, $\alpha_h$ is the efficiency coefficient of heating and it has, for example, the unit of [energy/unit temperature degree] such as [KWh/° F.] or [BTU/° F.]. It is the energy consumption required to heat a building for a unit of temperature differential from the base temperature, e.g., $(T^*-T)$. That is, it is energy needed for 1 heating degree with respect to outside temperature. The more heating efficient a building is, the smaller the $\alpha_h$ would be. $\beta_h$ is y-intersection of the heating regression line.

Figure 5:
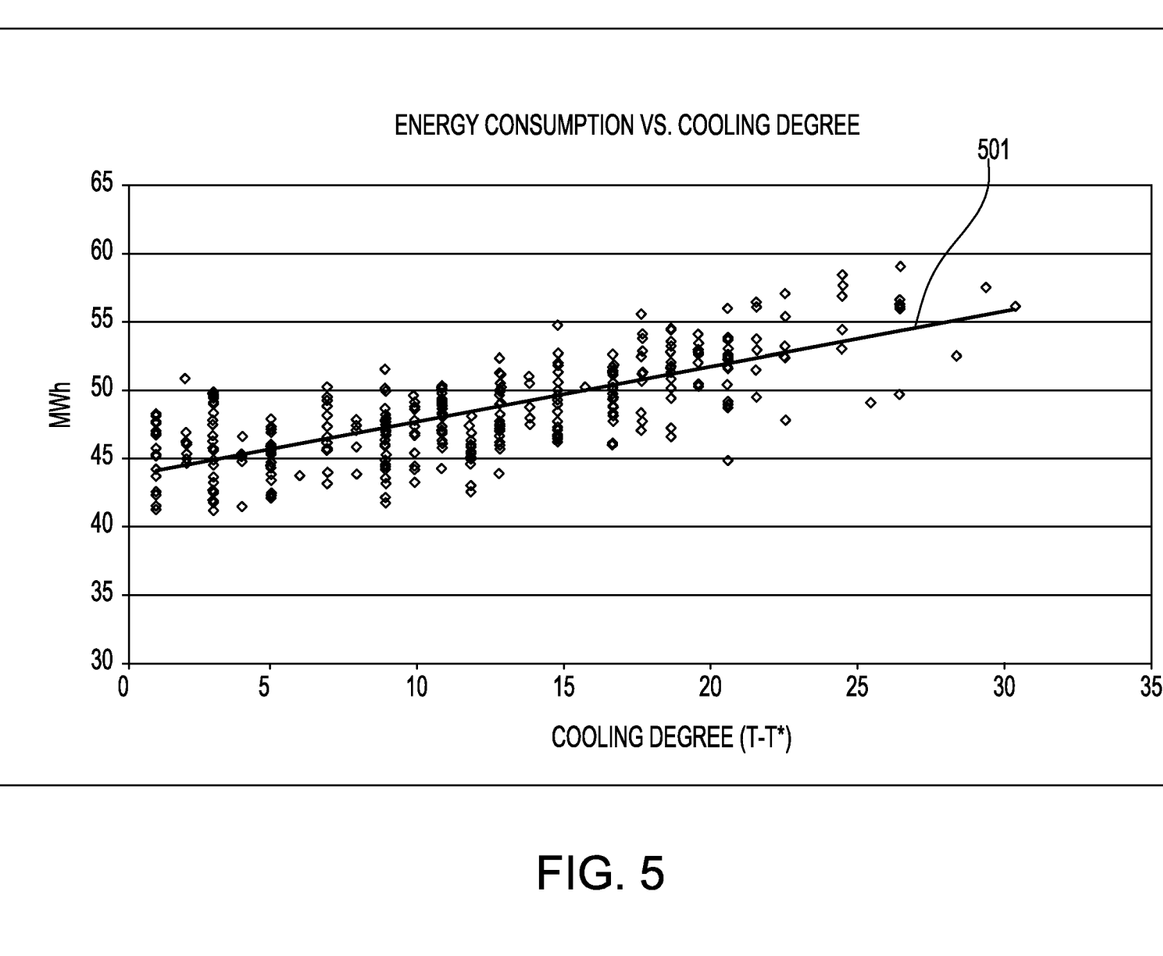
FIG. 5 illustrates a regression line for sample energy consumption with respect to cooling degree.

The efficiency coefficient of cooling may be computed by correlating energy consumption with respect to a cooling degree, (which is defined as $(T-T^*)$, where $T^*$ is the base temperature defined above, and T is the temperature value of each data point of the correlated time-series data of past energy consumption and time-series data of temperature (e.g., shown in FIG. 3). T, the temperature value of each data point may be the recorded average temperature outside the building being analyzed. The efficiency coefficient of cooling may be computed by using the data points in the data segment area 2 (302 in FIG. 3) correlated to $(T^*-T)$, and by obtaining a linear regression line (501) as shown in FIG. 5. The cooling regression line has an expression:

$$E_c = \alpha_c \cdot (T-T^*) + \beta_c \quad \text{(Equation 2)}$$

Here, $\alpha_c$ is the efficiency coefficient of cooling and it has, for example, the unit of [energy/unit temperature degree] such as [KWh/° F.] or [BTU/° F.]. It is the energy consumption required to cool a building for a unit of temperature differential from the base temperature, e.g., $(T-T^*)$. That is, it is energy needed for 1 cooling degree with respect to outside temperature. The more cooling efficient a building is, the smaller the $\alpha_c$ would be. $\beta_c$ is y-intersection of the cooling regression line.

Figure 6:
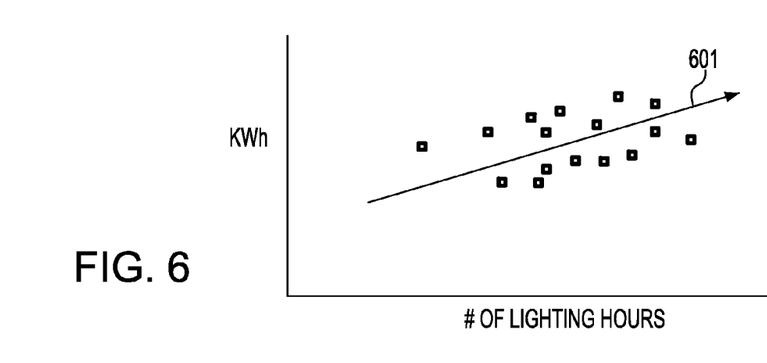
FIG. 6 illustrates a regression line for sample energy consumption with respect to lighting use.

The efficiency coefficient of other energy consumption type, which does not depend on weather (e.g., outside temperature) may be computed from the data points in area 3 (303 in FIG. 3). For instance, energy consumption for lighting may be computed by plotting or correlating energy consumption data with respect to the number of hours where lighting is used ($h_l$). The lighting regression line (601 in FIG. 6) has an expression:

$$E_l = \alpha_l \cdot h_l + \beta_l \quad \text{(Equation 3)}$$

Here, $\alpha_l$ is the efficiency coefficient of lighting and it has, for example, the unit of [energy/unit lighting hour] such as [KWh/hour]. It is the energy consumption required to light a building for a unit of lighting hours, e.g., $h_l$. The more lighting efficient a building is, the smaller the $\alpha_l$ would be. $\beta_l$ is y-intersection of the lighting line.

Assessment of Energy Consumption Efficiency

The efficiency coefficients of heating, $\alpha_h$, and cooling, $\alpha_c$, are energy consumption required for heating or cooling a building for a unit of temperature differential from the base temperature. The efficiency coefficients of heating, $\alpha_h$, and cooling, $\alpha_c$, are proportional to the size of the building. The larger a building is, the larger the efficiency coefficients are. For this reason it may useful to scale the efficiency coefficients with building characteristics such as size, area, space, or volume of building. In another aspect, the energy efficiency coefficients may be scaled with respect to other building characteristics. The scaled energy efficiency coefficients are useful for assessing or comparing a portfolio of many buildings with different characteristics. For instance, even if a building has high efficiency coefficient of heating, $\alpha_h$, if the building has a very large space, the real efficiency coefficient (i.e., efficiency coefficient for unit area of the building) may not be that high with respect to other building that has low efficiency coefficient but with a very small space. Therefore, in order to assess the true efficiency coefficient that can be used to compare across different types or characteristics of buildings, the effective coefficients of heating, $\alpha_h$, and cooling, $\alpha_c$, are scaled with respect to building characteristics, for example, with respect to the area (e.g., square feet, or square meter, or others) or volume (cubic feet, cubic meter, or others) of building. Referring to FIG. 1, at 105, the efficiency coefficients of heating, $\alpha_h$, and cooling, $\alpha_c$ and/or other energy consumption activities such as lighting, e.g., $\alpha_l$, the efficiency coefficient of lighting are scaled. The scaling can be done with respect to a building characteristic (106 in FIG. 1) such as building space (e.g., square feet, cubic feet, or others), hours of operations, number of occupants for each building, and/or others. The scaling may be done by dividing the energy efficiency coefficients by the unit building characteristic. The scaled efficiency coefficient of heating and cooling are denoted as $\overline{\alpha}_h$ and $\overline{\alpha}_c$, whose units can be [energy/(unit temperature degree·unit building characteristic)] such as [KWh/(° F.·ft²)], [KWh/(° F.·hr.)] or [BTU/(° F.·ft².)] or others.

Figure 7:
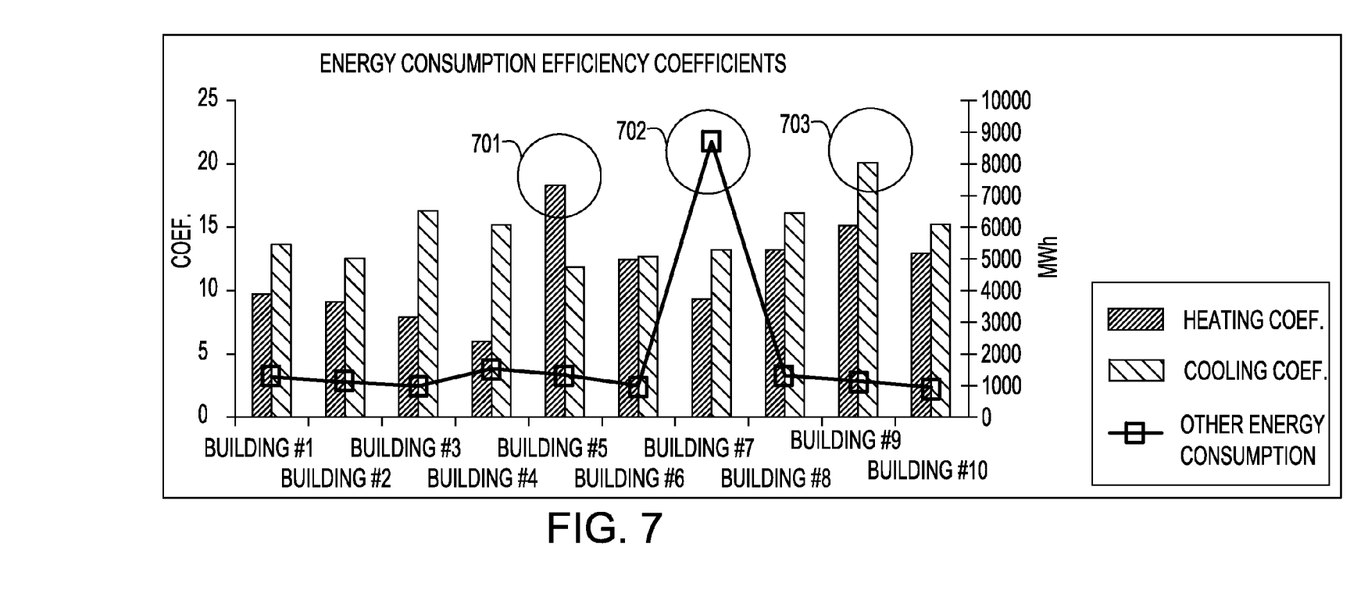
FIG. 7 shows examples of scaled efficiency coefficients for heating, cooling, and other activities such as lighting associated with each of a plurality of buildings.

At 107, the efficiencies of energy consumption can be assessed and compared among buildings. For instance, FIG. 7 shows the scaled efficiency coefficients for heating, cooling, and other activities (e.g., energy consuming activities) such as lighting associated with each of a plurality of buildings. By comparing scaled efficiency coefficients for various energy consuming activities, buildings with high and low energy consumption efficiencies can be identified. In an illustrative example, 701 in FIG. 7 shows a building with unusually low heating efficiency (i.e., a high $\overline{\alpha}_h$), and 703 shows a building with unusually low cooling efficiency (i.e., a high $\overline{\alpha}_c$) and 702 shows a building with unusually low lighting efficiency (i.e., a high $\overline{\alpha}_l$). The efficiencies of energy consumption can also be assessed and compared among groups of buildings (i.e., average of the efficiencies among a group of buildings) so that groups of buildings with high and low energy consumption efficiencies can be identified.

Forecasting of Energy Consumption Efficiency

At 108, future energy consumption may be forecasted based on estimated weather (e.g., estimated or forecasted outside temperature) using the energy efficiency coefficients. The energy efficiency coefficients of heating, $\alpha_h$, and cooling, $\alpha_c$, represent energy consumption required for heating or cooling a building for a unit of temperature differential from the base temperature. If the temperature for future time period is estimated, the future energy consumption may be forecasted at 108 in FIG. 1 using the energy efficiency coefficients.

For forecasting energy consumption of future time periods (e.g., next N days with forecasted average temperature of each day, $T_1, T_2, T_3, \ldots T_N$), the forecasted energy consumption for a building would be (considering only heating and cooling energy in this illustrative example):

$$E = \sum_{i=1}^{N} \{\alpha_h \cdot [T^* - T_i]^+ + [\beta_h]^{T^* > T_i} + \alpha_c \cdot [T_i - T^*]^+ + [\beta_c]^{T_i > T^*}\} \quad \text{(Equation 4)}$$

Here, the following notations are defined as:

$$[T^* - T_i]^+ = \begin{cases} T^* - T_i & \text{if } T^* > T_i \\ 0 & \text{if } T^* \leq T_i \end{cases}$$

$$[T_i - T^*]^+ = \begin{cases} T_i - T^* & \text{if } T_i > T^* \\ 0 & \text{if } T_i \leq T^* \end{cases}$$

$$[\beta_h]^{T^* > T_i} = \begin{cases} \beta_h & \text{if } T^* > T_i \\ 0 & \text{if } T^* \leq T_i \end{cases}$$

$$[\beta_c]^{T_i > T^*} = \begin{cases} \beta_c & \text{if } T_i > T^* \\ 0 & \text{if } T_i \leq T^* \end{cases}$$

$T_i$ here is forecasted outside temperature data corresponding to i-th future period for which the energy consumption is to be forecasted. Energy consumption for a group of buildings can also be forecasted by aggregating the forecast of individual buildings (e.g., by taking average of forecasted energy consumption of each building).

Simulation of Energy Consumption

The energy efficiency coefficients of heating, $\alpha_h$, and cooling, $\alpha_c$, represent energy consumption required for heating and cooling respectively, a building for a unit of temperature differential from the base temperature. Given the energy efficiency coefficients of heating, $\alpha_h$, and cooling, $\alpha_c$, the energy consumption of a hypothetical building with certain hypothetical energy efficiency for certain hypothetical outside temperature may be simulated (estimated) at 109 in FIG. 1.

As an illustrative example, consider an existing building with $\alpha_h, \beta_h, \alpha_c, \beta_c$. Now consider a hypothetical improvement, for example, the building is to have an expected x % improvement of heating efficiency and expected y % improvement of cooling efficiency, for example, by changing some factors such as change of equipment (e.g., heater, air conditioner), weatherization, insulation, or other improving actions. Also consider hypothetical outside temperature for N future periods as being $T_1, T_2, T_3, \ldots T_N$. The estimated energy consumption for this hypothetical situation would be:

$$E = \sum_{i=1}^{N} \left\{ \frac{(100-x)}{100} \cdot \alpha_h \cdot [T^* - T_i]^+ + [\beta_h]^{T^* > T_i} + \frac{(100-y)}{100} \alpha_c \cdot [T_i - T^*]^+ + [\beta_c]^{T_i > T^*} \right\}$$

As another illustrative example, for a hypothetical building with similar characteristics as the existing building (which has $\overline{\alpha}_h, \beta_h, \overline{\alpha}_c, \beta_c$) but with different area of z square feet, with x % expected improvement of heating efficiency and y % expected improvement of cooling efficiency and with hypothetical outside temperature for N periods, i.e., $T_1, T_2, T_3, \ldots T_N$, the estimated energy consumption would be:

$$E = \sum_{i=1}^{N} \left\{ \frac{(100-x)}{100} \cdot z \cdot \overline{\alpha}_h \cdot [T^* - T_i]^+ + [\beta_h]^{T^* > T_i} + \frac{(100-y)}{100} \cdot z \cdot \overline{\alpha}_c \cdot [T_i - T^*]^+ + [\beta_c]^{T_i > T^*} \right\}$$

It is noted that for the above simulation (e.g., at 109), either the energy efficiency coefficients (e.g., computed at 104) or the scaled energy efficiency coefficients (e.g., computed at 105) may be used.

It is useful to assess the efficiency of energy consumption for various buildings using energy efficiency indicator (referred to herein as energy efficiency coefficients) so that buildings with similar characteristics can be compared and energy-efficient/inefficient buildings are identified. For buildings with inefficient energy consumption, energy efficiency initiatives such as upgrading of heating and cooling equipment, setting different thermostat profile, weatherization, etc. can be deployed to reduce energy consumption. It is also useful to forecast energy consumption of buildings in future time period (next few days, months etc.) based on estimated future weather conditions such as air temperature to better plan the sourcing, procurement and production of energy so that cost effective and environmentally friendly energy supply is planned in advance. In addition, it would also be useful to simulate (estimate) the energy consumption of certain types of building with certain hypothetical energy consumption efficiency and with certain hypothetical outside temperature profile so that energy expense is better managed and energy saving measures can be evaluated prior to implementation. Therefore, it would be very useful to compute one standard indicator, energy efficiency coefficients, and use the indicator for analyses of the assessment, forecasting and simulation of energy consumption.

The energy efficiency coefficient may be used to perform multiple functions, e.g., assess, forecast and simulate. Thus, for example, an energy efficiency coefficient for heating computed for a building may be used to assess the efficiencies of the building with one or more other buildings, the same energy efficiency coefficient for heating may be used to forecast future energy consumption for the building, and that same energy efficiency coefficient for heating may be used to simulate impact of weather pattern, change in energy efficiency and building characteristics on energy consumption for that building.

Similarly, for example, an energy efficiency coefficient for cooling computed for a building may be used to assess the efficiencies of the building with one or more other buildings, the same energy efficiency coefficient for cooling may be used to forecast future energy consumption for the building, and that same energy efficiency coefficient for cooling may be used to simulate impact of weather pattern, change in energy efficiency and building characteristics on energy consumption for that building.

Likewise, for example, an energy efficiency coefficient for other activity (e.g., lighting or others) computed for a building may be used to assess the efficiencies of the building with one or more other buildings, the same energy efficiency coefficient for other activity may be used to forecast future energy consumption for the building, and that same energy efficiency coefficient for other activity may be used to simulate impact of weather pattern, change in energy efficiency and building characteristics on energy consumption for that building.

In the present disclosure, the term "building" was used to refer to a structure for which energy consumption was assessed, forecasted and simulated. It is noted, however, that the method and system of the present disclosure may be applied to any other structures or the like for which energy consumption is desired to be measured, assessed, forecasted, and/or simulated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 8:
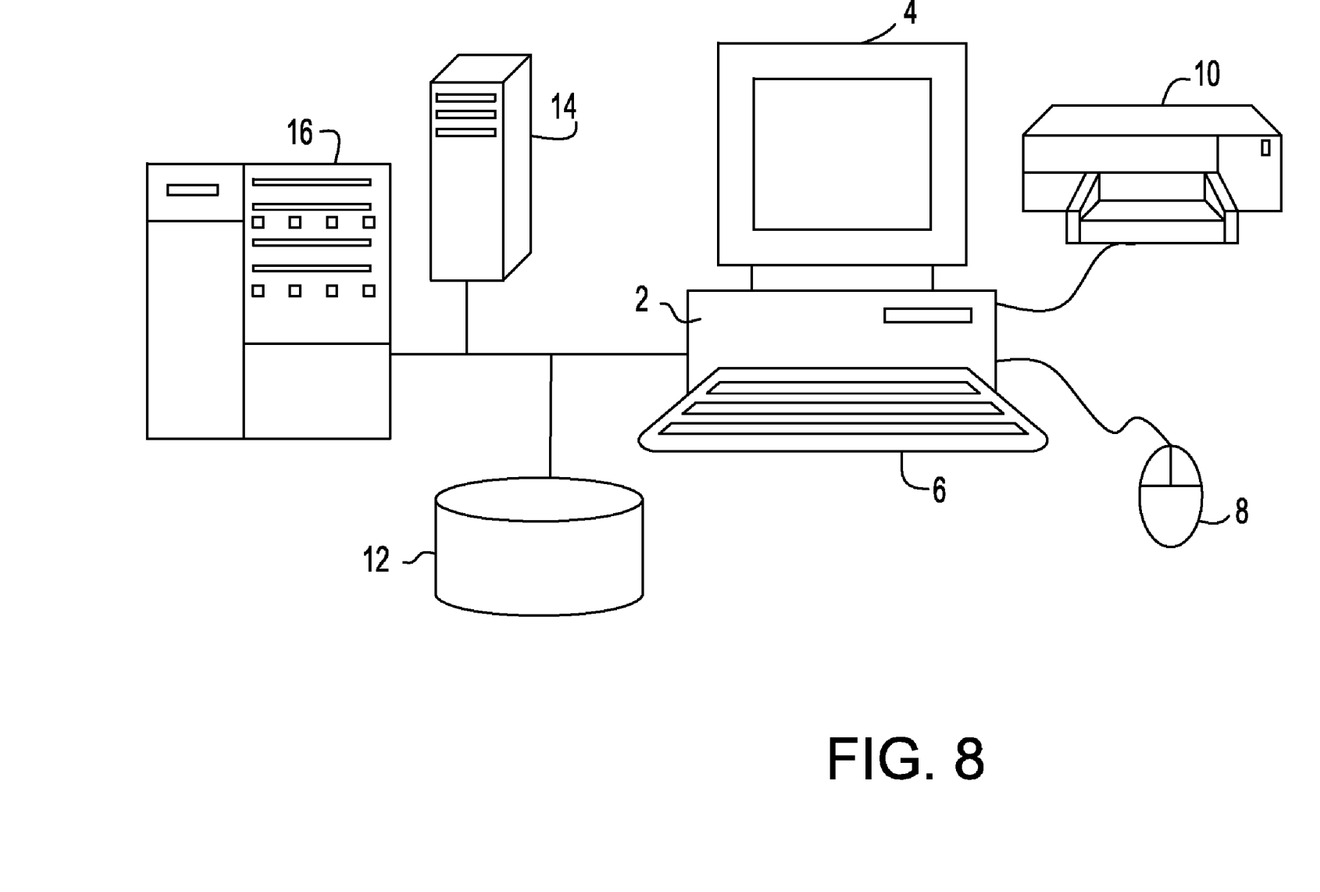
FIG. 8 illustrates an example of a computer system, in which the systems and methodologies of the present disclosure may be carried out or executed.

Referring now to FIG. 8, the systems and methodologies of the present disclosure may be carried out or executed in a computer system that includes a processing unit 2, which houses one or more processors and/or cores, memory and other systems components (not shown expressly in the drawing) that implement a computer processing system, or computer that may execute a computer program product. The computer program product may comprise media, for example a hard disk, a compact storage medium such as a compact disc, or other storage devices, which may be read by the processing unit 2 by any techniques known or will be known to the skilled artisan for providing the computer program product to the processing system for execution.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer processing system that carries out the system and method of the present disclosure may also include a display device such as a monitor or display screen 4 for presenting output displays and providing a display through which the user may input data and interact with the processing system, for instance, in cooperation with input devices such as the keyboard 6 and mouse device 8 or pointing device. The computer processing system may be also connected or coupled to one or more peripheral devices such as the printer 10, scanner (not shown), speaker, and any other devices, directly or via remote connections. The computer processing system may be connected or coupled to one or more other processing systems such as a server 10, other remote computer processing system 14, network storage devices 12, via any one or more of a local Ethernet, WAN connection, Internet, etc. or via any other networking methodologies that connect different computing systems and allow them to communicate with one another. The various functionalities and modules of the systems and methods of the present disclosure may be implemented or carried out distributedly on different processing systems (e.g., 2, 14, 16), or on any single platform, for instance, accessing data stored locally or distributedly on the network.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The computer system may be any type of known or will be known systems and may typically include a processor, memory device, a storage device, input/output devices, internal buses, and/or a communications interface for communicating with other computer systems in conjunction with communication hardware and software, etc.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

I claim:

1. A method for assessing, forecasting and simulating energy consumption of buildings using energy efficiency coefficients, comprising:

correlating, using a processor, energy consumption data of a building and temperature data outside the building collected over a period of time;

segmenting the correlated energy consumption data and temperature data into a plurality of segments including at least a heating consumption segment, a cooling segment, and temperature-insensitive segment;

determining an energy efficiency coefficient for heating from the heating consumption segment;
determining an energy efficiency coefficient for cooling from the cooling consumption segment;
determining an energy efficiency coefficient for other energy consuming activities from the temperature insensitive segment;
scaling the energy efficiency coefficients for heating, cooling and other energy consuming activity by building characteristics,
using the energy efficiency coefficient for heating, the energy efficiency coefficient for cooling and the energy efficiency coefficient for other energy consuming activities to assess energy efficiency among one or more buildings, forecast future consumption of energy in the building based on forecasted temperature, and simulate impact of hypothetical temperature and hypothetical energy efficiency on energy consumption in the building.

2. The method of claim 1, wherein the determining an energy efficiency coefficient for heating includes:
correlating energy consumption data in the heating consumption segment with respect to a heating degree;
deriving a heating linear regression line, $E_h = \alpha_h \cdot (T^* - T) + \beta_h$, from the correlated energy consumption data in the heating consumption segment with respect to a heating degree, wherein,
$E_h$ is energy consumed for heating,
$\alpha_h$ is the energy efficiency coefficient for heating,
$\beta_h$ is y-intersection of the heating regression line,
$T^*$ is a base reference temperature,
T is outside temperature;
and
wherein the determining an energy efficiency coefficient for cooling includes:
correlating energy consumption data in the cooling consumption segment with respect to a cooling degree;
deriving a cooling linear regression line, $E_c = \alpha_c \cdot (T - T^*) + \beta_c$, using the correlated energy consumption data in the cooling consumption segment with respect to a cooling degree, wherein,
$E_c$ is energy consumed for cooling,
$\alpha_c$ is the energy efficiency coefficient for cooling,
$\beta_c$ is y-intersection of the cooling regression line.

3. The method of claim 2, wherein the heating degree is $T^*-T$, wherein $T^*$ is obtained by performing a regression analysis on energy consumption data correlated with temperature data and selecting the temperature corresponding to minimum energy consumption on a non-linear regression curve obtained from the regression analysis.

4. The method of claim 2, wherein the cooling degree is $T-T^*$, wherein $T^*$ is obtained by performing a regression analysis on energy consumption data correlated with temperature data and selecting the temperature corresponding to minimum energy consumption on a non-linear regression curve obtained from the regression analysis.

5. The method of claim 2, wherein the step of using includes forecasting energy consumption by computing:

$$E = \sum_{i=1}^{N} \{\alpha_h \cdot [T^* - T_i]^+ + [\beta_h]^{T^* > T_i} + \alpha_c \cdot [T_i - T^*]^+ + [\beta_c]^{T_i > T^*}\},$$

wherein $$[T^* - T_i]^+ = \begin{cases} T^* - T_i & \text{if } T^* > T_i \\ 0 & \text{if } T^* \le T_i \end{cases}$$

$$[T_i - T^*]^+ = \begin{cases} T_i - T^* & \text{if } T_i > T^* \\ 0 & \text{if } T_i \le T^* \end{cases}$$

$$[\beta_h]^{T^* > T_i} = \begin{cases} \beta_h & \text{if } T^* > T_i \\ 0 & \text{if } T^* \le T_i \end{cases}$$

$$[\beta_c]^{T_i > T^*} = \begin{cases} \beta_c & \text{if } T_i > T^* \\ 0 & \text{if } T_i \le T^* \end{cases}$$

wherein,
E is energy consumption,
$T_i$ is forecasted outside temperature data corresponding to i-th future period for which the energy consumption is to be forecasted,
N is number of future time periods where the energy consumption is to be forecasted.

6. The method of claim 2, wherein the step of using includes simulating impact of hypothetical temperature and hypothetical energy efficiency on energy consumption in the building by computing:

$$E = \sum_{i=1}^{N} \left\{ \frac{(100-x)}{100} \cdot \alpha_h \cdot [T^* - T_i]^+ + [\beta_h]^{T^* > T_i} + \frac{(100-y)}{100} \alpha_c \cdot [T_i - T^*]^+ + [\beta_c]^{T_i > T^*} \right\},$$

wherein,
$T_i$ is forecasted temperature data corresponding to i-th future period where the energy consumption is to be forecasted,
N is number of future time periods for which the energy consumption is to be forecasted,
x is percent improvement of heating efficiency,
y is percent improvement of cooling efficiency.

7. The method of claim 2, wherein the step of using includes simulating impact of hypothetical temperature and hypothetical energy efficiency on energy consumption in the building by computing:

$$E = \sum_{i=1}^{N} \left\{ \frac{(100-x)}{100} \cdot z \cdot \overline{\alpha}_h \cdot [T^* - T_i]^+ + [\beta_h]^{T^* > T_i} + \frac{(100-y)}{100} \cdot z \cdot \overline{\alpha}_c \cdot [T_i - T^*]^+ + [\beta_c]^{T_i > T^*} \right\}$$

wherein,
$\overline{\alpha}_h$ is scaled energy efficiency coefficient for heating,
$\overline{\alpha}_c$ is scaled energy efficiency coefficient for cooling,
$T_i$ is the temperature data corresponding to i-th energy consumption data,
N is number of data samples of the energy consumption data and corresponding temperature data,
x is percent improvement of heating efficiency,
y is percent improvement of cooling efficiency,
z is building characteristic.

8. The method of claim 1, wherein the energy efficiency coefficient for heating is scaled to $\overline{\alpha}_h$ by dividing by one or more building characteristics; and the energy efficiency coefficient for cooling is scaled to $\overline{\alpha}_c$ by dividing by the one or more building characteristics.

9. The method of claim 8, wherein the one or more building characteristics include area of the building, volume of the building, number of occupants, or combinations thereof.

10. The method of claim 1, wherein the determining an energy efficiency coefficient for other energy consuming activities includes:
correlating energy consumption data in the temperature insensitive segment with respect to amount of time spent performing the other energy consuming activities;
deriving a linear regression line using the correlated energy consumption data in the temperature insensitive segment with respect to the amount of time spent performing the other energy consuming activities.

11. The method of claim 1, wherein the steps of correlating energy consumption data and temperature data outside the building, segmenting the correlated energy consumption data and temperature data outside the building, and determining energy efficiency coefficients are performed for a plurality of buildings, and
the step of using further includes scaling a plurality of the energy efficiency coefficients for heating, cooling and other energy consuming activities with respect to one or more characteristics of respective buildings, and comparing the plurality of scaled energy efficiency coefficients to assess energy efficiency of one or more of the plurality of buildings.

12. The method of claim 1, wherein each energy consumption data and temperature data is an average energy consumption data and temperature data outside the building, respectively, of a predetermined period.

13. The method of claim 1, wherein each energy consumption data represents energy consumption data of a group of buildings.

14. A non-transitory computer readable storage medium storing a program of instructions executable by a machine to perform a method of assessing, forecasting and simulating energy consumption of buildings using energy efficiency coefficients, comprising:
correlating energy consumption data of a building and temperature data outside the building collected over a period of time;
segmenting the correlated energy consumption data and temperature data into a plurality of segments including at least a heating consumption segment, a cooling segment, and temperature-insensitive segment;
determining an energy efficiency coefficient for heating from the heating consumption segment;
determining an energy efficiency coefficient for cooling from the cooling consumption segment;
determining an energy efficiency coefficient for other energy consuming activities from the temperature insensitive segment;
scaling the energy efficiency coefficients for heating, cooling and other energy consuming activity by building characteristics,
using the energy efficiency coefficient for heating, the energy efficiency coefficient for cooling and the energy efficiency coefficient for other energy consuming activities to assess energy efficiency among one or more buildings, forecast future consumption of energy in the building based on forecasted temperature, and simulate impact of hypothetical temperature and hypothetical energy efficiency on energy consumption in the building.

15. The non-transitory computer readable storage medium of claim 14, wherein the energy efficiency coefficient for heating is scaled to $\overline{\alpha}_h$ by dividing by one or more building characteristics, and the energy efficiency coefficient for cooling is scaled to $\overline{\alpha}_c$ by dividing by the one or more building characteristics.

16. The non-transitory computer readable storage medium of claim 15, wherein the one or more building characteristics include area of the building, volume of the building, number of occupants, or combinations thereof.

17. The non-transitory computer readable storage medium of claim 14, wherein the determining an energy efficiency coefficient for heating includes:
correlating energy consumption data in the heating consumption segment with respect to a heating degree;
deriving a heating linear regression line, $E_h = \alpha_h \cdot (T^* - T) + \beta_h$, from the correlated energy consumption data in the heating consumption segment with respect to a heating degree, wherein
$E_h$ is energy consumed for heating,
$\alpha_h$ is the energy efficiency coefficient for heating,
$\beta_h$ is y-intersection of the heating regression line,
$T^*$ is a base reference temperature,
$T$ is outside temperature; and
wherein the determining an energy efficiency coefficient for cooling includes:
correlating energy consumption data in the cooling consumption segment with respect to a cooling degree;
deriving a cooling linear regression line, $E_c = \alpha_c \cdot (T - T^*) + \beta_c$, using the correlated energy consumption data in the cooling consumption segment with respect to a cooling degree, wherein
$E_c$ is energy consumed for cooling,
$\alpha_c$ is the energy efficiency coefficient for cooling,
$\beta_c$ is y-intersection of the cooling regression line.

18. The non-transitory computer readable storage medium of claim 17, wherein the step of using includes forecasting energy consumption by computing:

$$E = \sum_{i=1}^{N} \{\alpha_h \cdot [T^* - T_i]^+ + [\beta_h]^{T^* > T_i} + \alpha_c \cdot [T_i - T^*]^+ + [\beta_c]^{T_i > T^*}\},$$

wherein $$[T^* - T_i]^+ = \begin{cases} T^* - T_i & \text{if } T^* > T_i \\ 0 & \text{if } T^* \leq T_i \end{cases}$$

$$[T_i - T^*]^+ = \begin{cases} T_i - T^* & \text{if } T_i > T^* \\ 0 & \text{if } T_i \leq T^* \end{cases}$$

$$[\beta_h]^{T^* > T_i} = \begin{cases} \beta_h & \text{if } T^* > T_i \\ 0 & \text{if } T^* \leq T_i \end{cases}$$

$$[\beta_c]^{T_i > T^*} = \begin{cases} \beta_c & \text{if } T_i > T^* \\ 0 & \text{if } T_i \leq T^* \end{cases}$$

$T_i$ is forecasted outside temperature data corresponding to i-th future period for which the energy consumption is to be forecasted,
N is number of future time periods where the energy consumption is to be forecasted.

19. The non-transitory computer readable storage medium of claim 17, wherein the step of using includes simulating impact of hypothetical temperature and hypothetical energy efficiency on energy consumption in the building by computing:

$$E = \sum_{i=1}^{N} \left\{ \frac{(100-x)}{100} \cdot \alpha_h \cdot [T^* - T_i]^+ + [\beta_h]^{T^* > T_i} + \frac{(100-y)}{100} \alpha_c \cdot [T_i - T^*]^+ + [\beta_c]^{T_i > T^*} \right\},$$

wherein
- $T_i$ is forecasted temperature data corresponding to i-th future period for which the energy consumption is to be forecasted,
- N is number of future time periods where the energy consumption is to be forecasted,
- x is percent improvement of heating efficiency,
- y is percent improvement of cooling efficiency.

20. The non-transistory computer readable storage medium of claim 17, wherein the step of using includes simulating impact of hypothetical temperature and hypothetical energy efficiency on energy consumption in the building by computing:

$$E = \sum_{i=1}^{N} \left\{ \frac{(100-x)}{100} \cdot z \cdot \overline{\alpha}_h \cdot [T^* - T_i]^+ + [\beta_h]^{T^* > T_i} + \frac{(100-y)}{100} \cdot z \cdot \overline{\alpha}_c \cdot [T_i - T^*]^+ + [\beta_c]^{T_i > T^*} \right\}$$

wherein,
- $\overline{\alpha}_h$ is scaled energy efficiency coefficient for heating,
- $\overline{\alpha}_c$ is scaled energy efficiency coefficient for cooling,
- $T_i$ is the temperature data corresponding to i-th energy consumption data,
- N is number of data samples of the energy consumption data and corresponding temperature data,
- x is percent improvement of heating efficiency,
- y is percent improvement of cooling efficiency,
- z is building characteristic.

21. The non-transistory computer readable storage medium of claim 14, wherein the steps of correlating energy consumption data and temperature data outside the building, segmenting the correlated energy consumption data and temperature data outside the building, and determining energy efficiency coefficients are performed for a plurality of buildings, and
the step of using further includes scaling a plurality of the energy efficiency coefficients for heating, cooling and other energy consuming activities with respect to one or more characteristics of respective buildings, and comparing the plurality of scaled energy efficiency coefficients to assess energy efficiency of one or more of the plurality of buildings.

22. A system for assessing, forecasting and simulating energy consumption of buildings using energy efficiency coefficients, comprising:
a processor;
a memory operable to store energy consumption data of a building and temperature data outside the building collected over a period of time;
the processor operable to correlate energy consumption data of a building and temperature data outside the building collected over a period of time;
the processor further operable to segment the correlated energy consumption data and temperature data into a plurality of segments including at least a heating consumption segment, a cooling segment, and temperature-insensitive segment;
the processor further operable to determine an energy efficiency coefficient for heating from the heating consumption segment;
the processor further operable to determine an energy efficiency coefficient for cooling from the cooling consumption segment;
the processor further operable to determine an energy efficiency coefficient for other energy consuming activities from the temperature insensitive segment;
the processor further operable to scale the energy efficiency coefficient for heating, the energy efficiency coefficient for cooling and the energy efficiency coefficient for other energy consuming activities according to one or more building characteristics;
the processor further operable to use the energy efficiency coefficient for heating, the energy efficiency coefficient for cooling and the energy efficiency coefficient for other energy consuming activities to assess energy efficiency among one or more buildings, forecast future consumption of energy in the building based on forecasted temperature and simulate impact of hypothetical temperature and hypothetical energy efficiency on energy consumption in the building.

23. The system of claim 22, wherein the processor is operable to determine the energy efficiency coefficient for heating by:
correlating energy consumption data in the heating consumption segment with respect to a heating degree;
deriving a heating linear regression line, $E_h = \alpha_h \cdot (T^* - T) + \beta_h$, from the correlated energy consumption data in the heating consumption segment with respect to a heating degree, wherein
- $E_h$ is energy consumed for heating,
- $\alpha_h$ is the energy efficiency coefficient for heating,
- $\beta_h$ is y-intersection of the heating regression line,
- $T^*$ is a base reference temperature,
- T is outside temperature; and the processor is operable to determine the energy efficiency coefficient for cooling is determined by:
correlating energy consumption data in the cooling consumption segment with respect to a cooling degree;
deriving a cooling linear regression line, $E_c = \alpha_c \cdot (T - T^*) + \beta_c$, using the correlated energy consumption data in the cooling consumption segment with respect to a cooling degree, wherein
- $E_c$ is energy consumed for cooling,
- $\alpha_c$ is the energy efficiency coefficient for cooling,
- $\beta_c$ is y-intersection of the cooling regression line.

24. The system of claim 23, wherein the processor is operable to forecast energy consumption by computing:

$$E = \sum_{i=1}^{N} \left\{ \alpha_h \cdot [T^* - T_i]^+ + [\beta_h]^{T^* > T_i} + \alpha_c \cdot [T_i - T^*]^+ + [\beta_c]^{T_i > T^*} \right\},$$

wherein $$[T^* - T_i]^+ = \begin{cases} T^* - T_i & \text{if } T^* > T_i \\ 0 & \text{if } T^* \le T_i \end{cases}$$

$$[T_i - T^*]^+ = \begin{cases} T_i - T^* & \text{if } T_i > T^* \\ 0 & \text{if } T_i \le T^* \end{cases}$$

$$[\beta_h]^{T^* > T_i} = \begin{cases} \beta_h & \text{if } T^* > T_i \\ 0 & \text{if } T^* \le T_i \end{cases}$$

$$[\beta_c]^{T_i > T^*} = \begin{cases} \beta_c & \text{if } T_i > T^* \\ 0 & \text{if } T_i \le T^* \end{cases}$$

$T_i$ is forecasted outside temperature data corresponding to i-th future period where the energy consumption is to be forecasted, N is number of future time periods where the energy consumption is to be forecasted.

25. The system of claim 23, wherein the processor is operable to simulate impact of hypothetical temperature and hypothetical energy efficiency on energy consumption in the building by computing:

$$E = \sum_{i=1}^{N} \left\{ \frac{(100-x)}{100} \cdot \alpha_h \cdot [T^* - T_i]^+ + [\beta_h]^{T^* > T_i} + \frac{(100-y)}{100} \alpha_c \cdot [T_i - T^*]^+ + [\beta_c]^{T_i > T^*} \right\},$$

wherein $T_i$ is forecasted temperature data corresponding to i-th future period for which the energy consumption is to be forecasted, N is number of future time periods where the energy consumption is to be forecasted, x is percent improvement of heating efficiency, y is percent improvement of cooling efficiency.

\* \* \* \* \*